(12) United States Patent
Shu et al.

(10) Patent No.: US 11,017,996 B2
(45) Date of Patent: May 25, 2021

(54) AUTOMATED PARTICLE REMOVAL SYSTEM

(71) Applicant: ASM Technology Singapore Pte Ltd, Singapore (SG)

(72) Inventors: Gang Shu, Singapore (SG); Chin Tiong Ong, Singapore (SG); Keng Yew Song, Singapore (SG); Qing Le Tan, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 133 days.

(21) Appl. No.: 16/375,913

(22) Filed: Apr. 5, 2019

(65) Prior Publication Data

US 2020/0321211 A1    Oct. 8, 2020

(51) Int. Cl.
| | | |
|---|---|---|
| *H01L 21/02* | (2006.01) | |
| *H01L 21/66* | (2006.01) | |
| *G01N 21/95* | (2006.01) | |
| *G01N 21/94* | (2006.01) | |
| *B08B 7/00* | (2006.01) | |

(52) U.S. Cl.
CPC ...... *H01L 21/02096* (2013.01); *B08B 7/0028* (2013.01); *G01N 21/94* (2013.01); *G01N 21/9501* (2013.01); *H01L 22/12* (2013.01); *H05K 2203/0271* (2013.01)

(58) Field of Classification Search
CPC ......... G01L 1/00–26; G01L 5/00–288; G01N 21/94; G01N 21/9501; G01N 21/9511; B08B 7/0028; B08B 1/002; B08B 1/003; B08B 1/02; H05K 2203/0257; H05K 2203/0271; H01L 22/12; H01L 21/02–02096; H01L 21/67046
See application file for complete search history.

(56) References Cited

U.S. PATENT DOCUMENTS

| | | | |
|---|---|---|---|
| 6,237,176 B1 * | 5/2001 | Egoshi | B08B 7/0028 15/102 |
| 2002/0071115 A1 * | 6/2002 | Batchelder | G01N 21/47 356/237.1 |
| 2016/0129483 A1 * | 5/2016 | Sung | B08B 1/007 134/6 |
| 2017/0008041 A1 * | 1/2017 | Hamilton | B08B 7/0028 |
| 2018/0313757 A1 * | 11/2018 | Rochford | G02B 21/16 |

* cited by examiner

*Primary Examiner* — Mikhail Kornakov
*Assistant Examiner* — Richard Z. Zhang
(74) *Attorney, Agent, or Firm* — Ostrolenk Faber LLP

(57) ABSTRACT

A foreign particle removal system for removing a particle from a surface of a fragile object has a tool gripper which grips a particle removal tool. A force sensing device determines a cleaning position of the particle removal tool relative to the surface whereat a threshold force is exerted on the surface, the threshold force being a force that is exerted by the particle removal tool on the surface that would pick up the foreign particle but would not damage the object. The particle removal tool is conveyed over a location of the foreign particle and is moved towards the surface to the cleaning position whereat the threshold force is exerted on the surface. The particle removal tool is then lifted away from the surface together with the foreign particle.

13 Claims, 4 Drawing Sheets

AUTOMATED PARTICLE REMOVAL SYSTEM

FIELD OF THE INVENTION

The invention relates to the removal of foreign particles, and in particular, small-sized debris from fragile surfaces.

BACKGROUND AND PRIOR ART

CMOS (complementary metal oxide semiconductor) sensors are used to optically capture images in digital cameras. In the semiconductor industry, foreign particles (particularly debris) on CMOS sensor surfaces during the manufacture of CMOS sensors are strictly controlled and should be eliminated in the manufactured product. Although cleaning using chemicals or water is typically conducted to wash foreign particles away from the CMOS sensor surface, physical inspection should also be performed to inspect the sensor surface thereafter for the presence of foreign particles, as these might adversely affect the quality of images captured by the CMOS sensor.

Such inspection of the CMOS sensor surface for foreign particles may be conducted manually by human operators or automatically by Automated Optical Inspection ("AOI") machines. If foreign particles are found, a human operator will typically use a suitable tool to manually remove such particles individually.

One concern with the aforesaid approach is that the CMOS sensor may be damaged during the removal of particles when using a tool to pick up these particles, as such tools will typically make contact with the CMOS sensor surface. Meanwhile, manual removal of particles is also a slow and laborious process.

It would be beneficial to not only automate the process of removing foreign particles to avoid the need for manual intervention, but in automating the process, it would be further beneficial for contact between the removal tool and the CMOS sensor surface to be monitored in order to avoid inadvertent damage being done to the CMOS sensor surface.

SUMMARY OF THE INVENTION

It is thus an object of the present invention to seek to provide an automated method and apparatus for removing foreign particles from a surface of a fragile object, while reducing the risk of damage to the object surface when doing so.

According to a first aspect of the invention, there is provided a method for removing a foreign particle from a surface of a fragile object, the method comprising the steps of: gripping a particle removal tool with a tool gripper; determining with a force sensing device a cleaning position of the particle removal tool relative to the surface whereat a threshold force is exerted on the surface, the threshold force being a force that is exerted by the particle removal tool on the surface that would pick up the foreign particle but would not damage the object; conveying the particle removal tool with the tool gripper over a location of the foreign particle and moving the particle removal tool towards the surface to the cleaning position whereat the threshold force is exerted on the surface; and lifting the foreign particle away from the surface with the particle removal tool.

According to a second aspect of the invention, there is provided an apparatus for removing a foreign particle from a surface of a fragile object, the apparatus comprising: a tool gripper which is operative to grip a particle removal tool, to convey the particle removal tool over a location of the foreign particle and to move the particle removal tool towards the surface to a cleaning position of the particle removal tool relative to the surface whereat a threshold force is exerted on the surface, and to lift the particle removal tool carrying the foreign particle away from the surface; and a force sensing device for determining the cleaning position; wherein the threshold force is a force that is exerted by the particle removal tool on the surface that would pick up the foreign particle but would not damage the object.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

Examples of methods and apparatus for the removal of foreign particles from an object surface in accordance with the invention will now be described with reference to the accompanying drawings, in which.

DETAILED DESCRIPTION OF THE PREFERRED EMBODIMENTS

Figure 1:
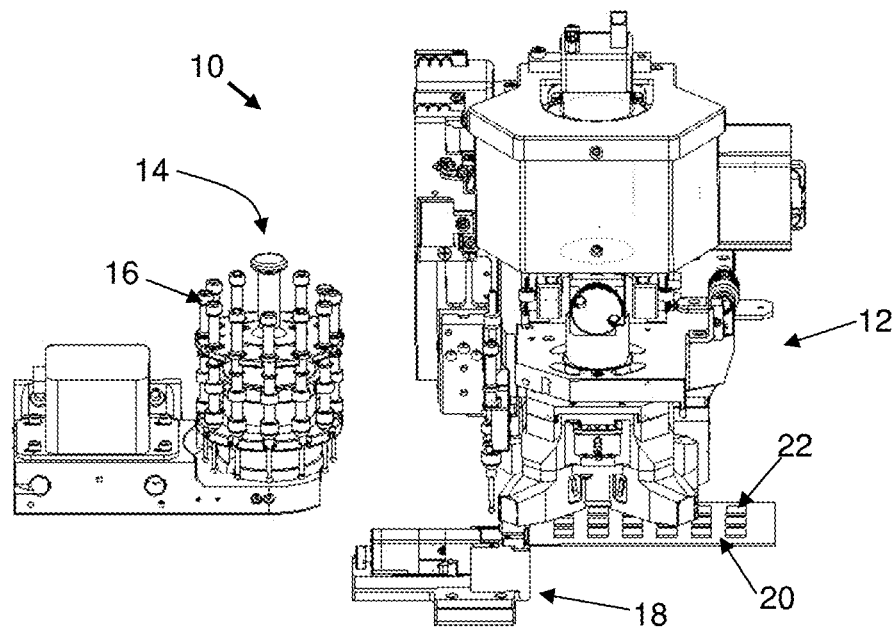
FIG. 1 is an overview of a cleaning apparatus comprising a particle removal system according to a preferred embodiment of the invention.

FIG. 1 is an overview of a cleaning apparatus 10 comprising a particle removal system for removing a foreign particle from a surface of a fragile object according to a preferred embodiment of the invention. The cleaning apparatus 10 generally comprises an automated optical inspection device 12, a cleaning tool station 14 which contains a supply of multiple particle removal tools 16, and an optical device such as an up-look optical device 18. In the illustrated embodiment, the particle removal tools 16 are in the form of gel sticks, wherein a gel-like substance is attached to one end of a stick. Such gel-like substance is operative to attract small foreign particles and to remove them from surfaces of objects. However, the invention is not intended to be limited to particle removal tools in the form of gel sticks.

For the purpose of identifying foreign particles on inspected fragile objects, such as CMOS sensors 22 that are arranged and carried on a carrier 20, the carrier 20 is placed under the automated optical inspection device 12 for inspection of the CMOS sensors 22.

Figure 2:
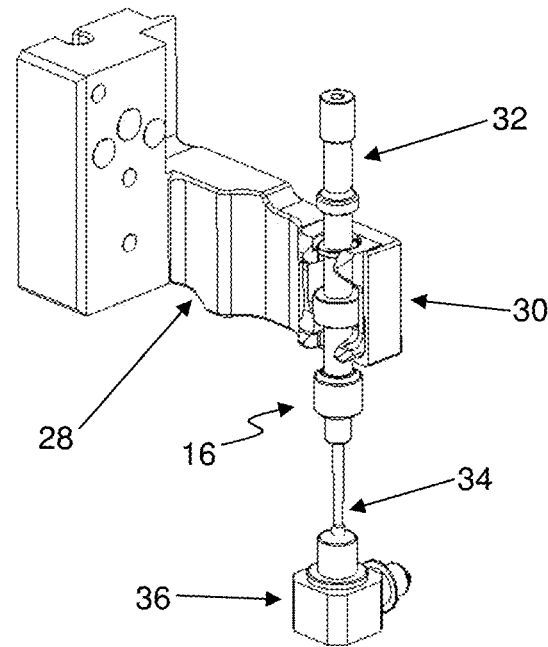
FIG. 2 is an isometric view of a tool gripper holding a particle removal tool, the particle removal tool being made to contact an external force sensor.

FIG. 2 is an isometric view of a tool gripper 30 holding the particle removal tool 16, the particle removal tool 16 being made to contact a force sensing device, which may be in the form of a force/pressure transducer. The force/pressure transducer may be an external force sensor 36 which is separate from both the tool gripper 30 and the particle removal tool 16. As mentioned above, the particle removal tool 16 comprises a gel stick 34 having a gel-like substance at one end thereof, and the gel stick 34 is attached to a stick holder 32. The tool gripper 30 is supported by a tool gripper arm 28, and grips onto a portion of the stick holder 32 which has been adapted for this purpose.

In this embodiment, the external force sensor 36 is located at a force calibration station that is positioned next to the up-look optical device 18. A force is applied by the tool gripper arm 28 onto the gel stick 34 when the gel stick 34 is in contact with the force sensor 36 by gradually decreasing a distance between the tool gripper 30 and the external force sensor 36. A contact force exerted by the gel stick 34 onto the force sensor 36 is measured as a position of the gel stick 34 relative to the external force sensor 36 changes.

Figure 3:
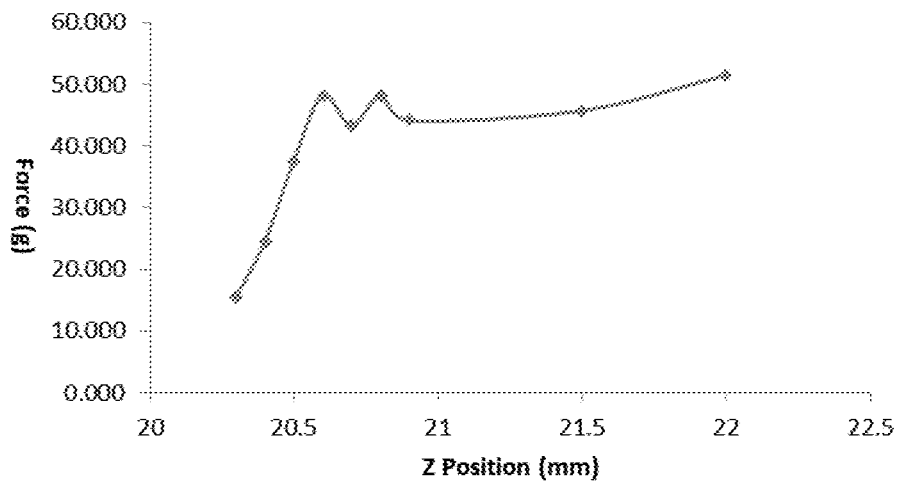
FIG. 3 is a graph showing an exemplary relationship between a vertical position of the particle removal tool and a force exerted by it on the external force sensor.

FIG. 3 is a graph showing an exemplary relationship between a vertical position of the gel stick 34 of the particle removal tool 16, and a force exerted by it on the external force sensor 36. As the gel stick 34 contacts and then further moves relative to the external force sensor 36, a contact force measured by the external force sensor 36 initially increases substantially to a certain peak value, which is about 50 g in the illustrated example.

As the vertical (or Z–) position of the gel stick 34 changes to push further against the external force sensor 36, the force measured may drop slightly due to deformation of the gel-like substance at the tip of the gel stick 34. When the gel stick 34 subsequently presses more onto the external force sensor 36 by lowering the vertical position of the gel stick 34, the contact force exerted steadily increases, but at a much lower rate than during initial contact. At this contact phase, a vertical cleaning position of the gel stick 34 relative to the external force sensor 36 (and thus the top surfaces of the CMOS sensors 22) is determined where the gel stick 34 exerts threshold force, which is a sufficient contact force to attract and pick up a foreign particle from a CMOS sensor 22, but does not exert excessive force to damage the CMOS sensor 22.

Figure 4:
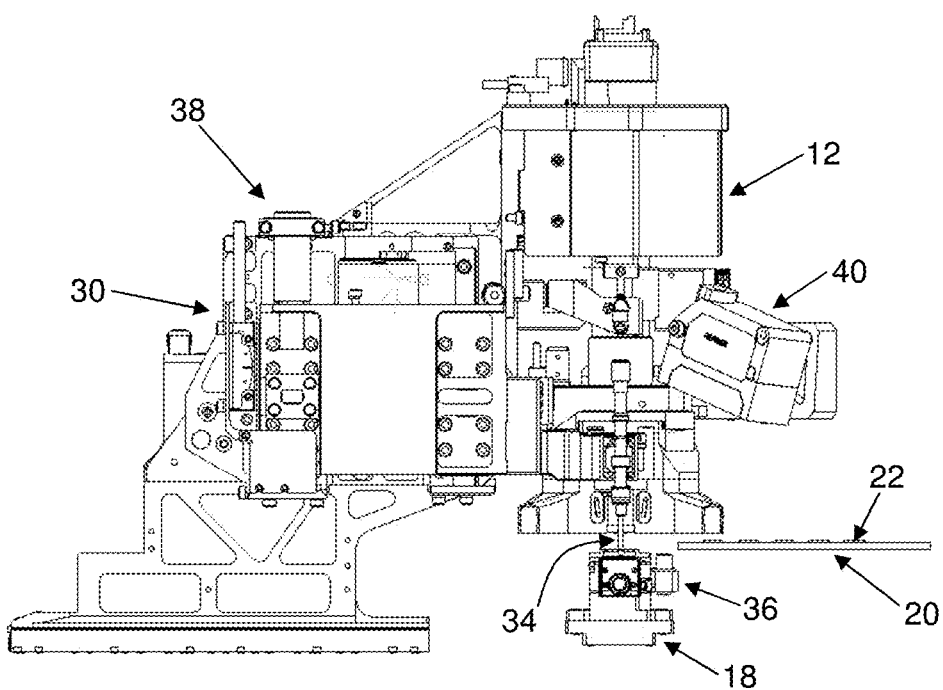
FIG. 4 is a side view of the particle removal system of FIG. 1, including the external force sensor of FIG. 2.

FIG. 4 is a side view of the cleaning apparatus 10 of the particle removal system of FIG. 1, including the external force sensor 36 of FIG. 2. A tool gripper motor 38 of the tool gripper 30 has actuated the tool gripper 30 to grip onto a particle removal tool 16 at the cleaning tool station 14. The particle removal tool 16 gripped by the tool gripper 30 is then moved to a position of an up-look optical device 18 to determine a horizontal position of the tip of the gel stick 34, before the gel stick 34 is actuated to apply a contact force onto the external force sensor 36 that is next to the up-look optical device 18.

After analyzing the contact forces exerted on the external force sensor 36 relative to vertical positions of the gel stick 34 so as to find the cleaning position, the cleaning apparatus 10 would be ready to pick up foreign particles using the particle removal tool 16. After the automated optical inspection device 12 has inspected the surfaces of the CMOS sensors 22 arranged on the carrier 20, locations of foreign particles on the CMOS sensors 22 would be ascertained and noted. The particle removal tool 16 is conveyed by the tool gripper 30 over such locations where the foreign particles are found, and the gel stick 34 is moved towards the surfaces of the CMOS sensors 22 by lowering the particle removal tool 16 onto the said locations to the cleaning position whereat the threshold force is exerted on the surfaces to attract and to remove the foreign particles.

Figure 5A:
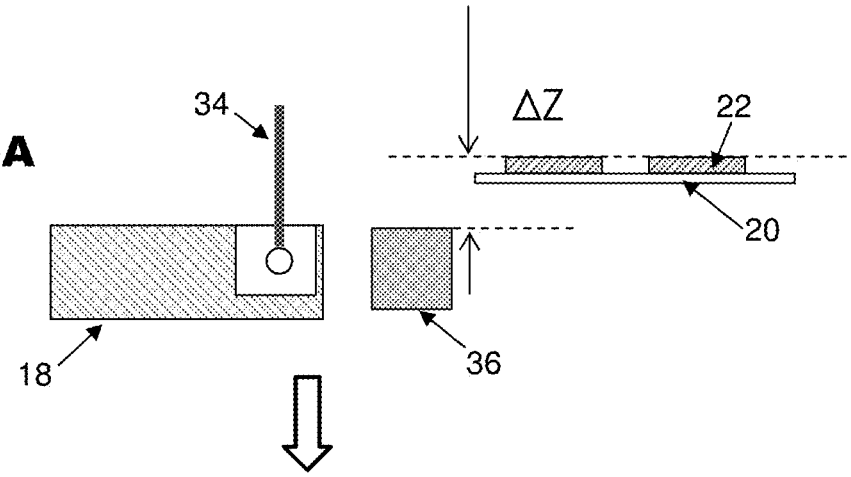
FIGS. 5A, 5B and 5C respectively illustrate the steps of an exemplary operational sequence of the particle removal system of FIG. 4.

FIG. 5 is an exemplary operational sequence of the particle removal system of FIG. 4. In FIG. 5A, the gel stick 34 is moved by the tool gripper 30 to a position above the up-look optical device 18 and a horizontal (X-Y) position of its tip is determined by the up-look optical device 18. A difference in height between coplanar top surfaces of the CMOS sensors 22 and a top surface of the external force sensor 36 ($\Delta Z$) is measured by a displacement sensor 40 (see FIG. 6). The difference in the level of the external force sensor 36 and of the device to be cleaned ($\Delta Z$) is noted.

Figure 5B:
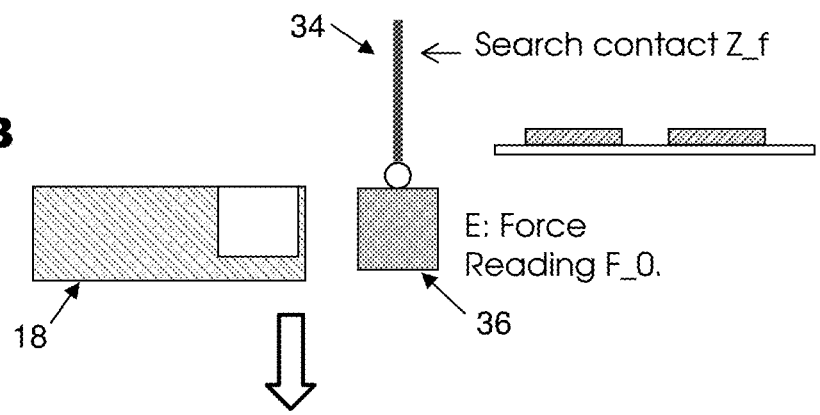

In FIG. 5B, after the horizontal position of the tip of the gel stick 34 has been determined, the gel stick 34 is conveyed to above the external force sensor 36 and the gel stick 34 is gradually lowered to search for contact with the external force sensor 36. In this search phase, there is no force exerted on the external force sensor 36. After contact between the gel stick 34 and the external force sensor 36 has been established and the gel stick 34 is lowered until a desired force reading F_0 is reached, a processor (not shown) coupled to the tool gripper 30 records a current encoder position Z_f of the tool gripper 30, where the force F_0 is reached.

Figure 5C:
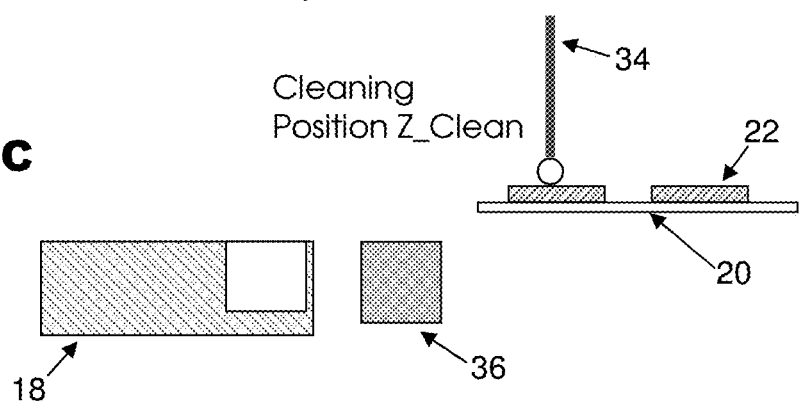

In FIG. 5C, the gel stick 34 is moved to a vertical cleaning position Z_Clean for cleaning a CMOS sensor 22 where foreign particles have been located, where: Z Clean=Zf+$\Delta Z$.

In particular, the gel stick 34 is moved to the determined vertical cleaning position Z_Clean relative to coplanar top surfaces of the CMOS sensors 22 for attracting foreign particles, and the gel stick 32 is then lifted away from the CMOS sensors 22 to remove the foreign particles. At the vertical cleaning position Z_Clean, the contact force exerted is equal to a threshold force, which would be a force that is exerted by the gel stick 34 on the surfaces of the CMOS sensors 22 that would pick up the foreign particles but would not damage the CMOS sensors 22.

Figure 6:
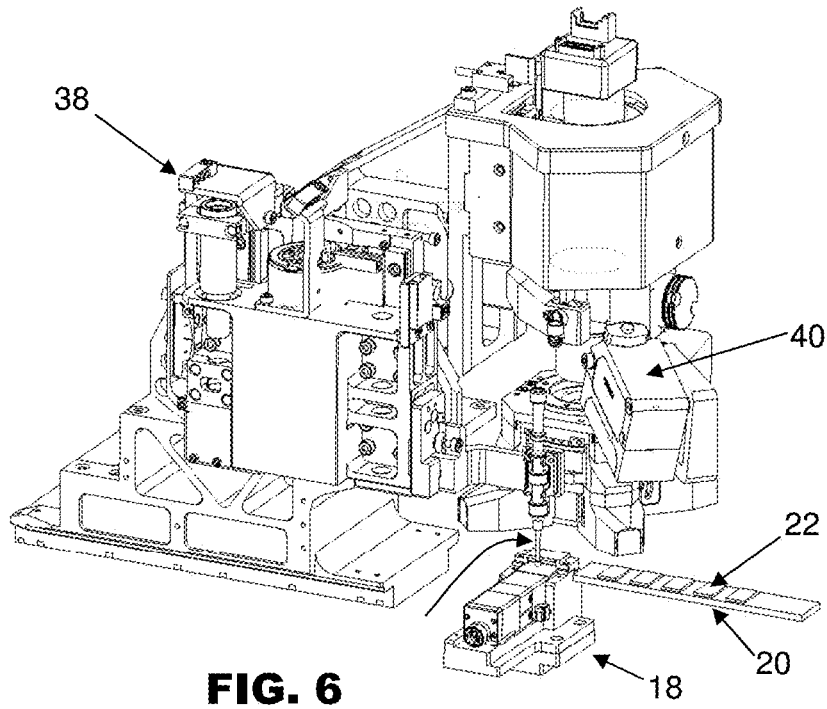
FIG. 6 is an isometric view of a particle removal system according to another preferred embodiment of the invention.

FIG. 6 is an isometric view of a particle removal system according to another preferred embodiment of the invention. In this embodiment, a force sensing device in the form of a contact force sensor 42 is coupled to the tool gripper 30 by incorporating the contact force sensor 42 in the tool gripper arm 28, so that prior assessment or calibration of a contact force exerted by the gel stick 34 at various vertical positions of the gel stick 34 is unnecessary.

The tool gripper arm 28 is similarly actuated by a tool gripper motor 38. An up-look optical device 18 is also used to determine a horizontal (X-Y) position of a tip of the gel stick 34. In addition, a displacement sensor 40 is coupled to the tool gripper 30 to monitor a vertical position of the gel stick 34 when it is moved by the tool gripper 30, particularly when the gel stick 34 contacts the plurality of CMOS sensors 22 arranged on the carrier 20 while removing foreign particles therefrom.

Figure 7A:
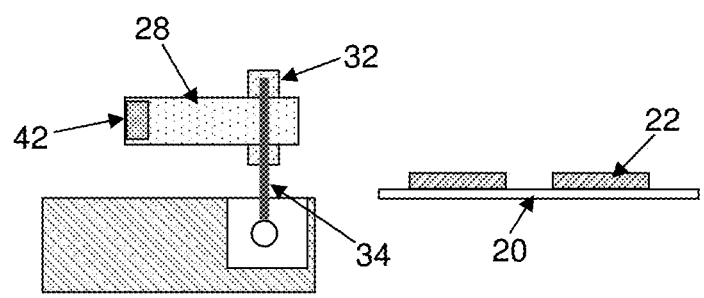
FIGS. 7A and 7B illustrate the steps of an exemplary operational sequence of the particle removal system of FIG. 6.

FIG. 7 is an exemplary operational sequence of the particle removal system of FIG. 6. In FIG. 7A, the tool gripper arm 28 which has a contact force sensor 42 coupled to it is gripping a particle removal tool 16 comprising a gel stick 34 over the up-look optical device 18. The horizontal (X-Y) position of the tip of the gel stick 34 is determined by the up-look optical device 18.

Figure 7B:
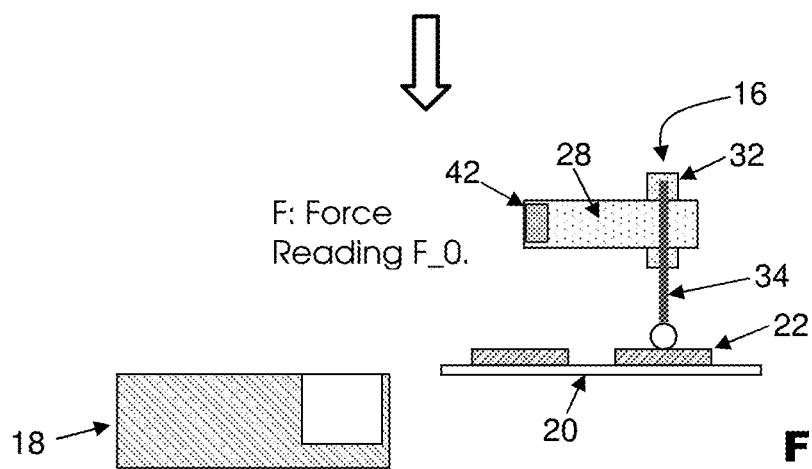

Next, in FIG. 7B, the tool gripper arm 28 directly conveys the particle removal tool 16 comprising the stick holder 32 and gel stick 34 over locations where foreign particles have been identified. Before the gel stick 34 contacts the top surfaces of the CMOS sensors 22, the contact force detected by the contact force sensor 42 is zero.

As the gel stick 34 is pushed against a CMOS sensor 22 to attract foreign particles, a reaction force that is exerted by the CMOS sensor 22 is detected by the contact force sensor 42. The contact force sensor 42 monitors the reaction force caused by downward pressure by the gel stick 34 on the CMOS sensor 22 until a predetermined threshold force $F\_0$ is reached when the gel stick 34 arrives at the cleaning position, wherein a further increase in force exerted may damage the CMOS sensor 22. At this point when the cleaning position is arrived at, the tool gripper arm 28 stops further downwards motion of the gel stick 34. The tool gripper arm 28 thereafter lifts the gel stick 34 away from the surface together with the foreign particle which the gel stick 34 has attracted, so as to remove the foreign particle.

It should be appreciated that the preferred embodiments of the invention introduce new force sensing control methods for an automated foreign particles removal system. Such force sensing may be conducted by a force/pressure transducer such as either a force sensor, a strain gauge or any other input transducer which is operative to measure force or pressure changes.

Thus, the preferred embodiments of the invention prevent damage being caused to the CMOS sensors 22 due to excessive contact forces applied by the gel stick 34 comprised in the particle removal tool 16 on the CMOS sensor 22 while performing automatic removal of foreign particles from CMOS sensors 22.

The resulting improvement ensures greater consistency in force control during the automated particle removal process. For instance, the new approach may cater for greater variations in the lengths of the particle removal tools 16 that may typically give rise to variations in contact forces exerted on the CMOS sensors 22.

The invention described herein is susceptible to variations, modifications and/or additions other than those specifically described and it is to be understood that the invention includes all such variations, modifications and/or additions which fall within the spirit and scope of the above description.

The invention claimed is:

1. Method for removing a foreign particle from a surface of a fragile object, the method comprising the steps of:
gripping a particle removal tool with a tool gripper;
determining with a force sensing device a cleaning position of the particle removal tool relative to the surface whereat a threshold force is exerted on the surface at the cleaning position, the threshold force being a force that is exerted by the particle removal tool on the surface that would pick up the foreign particle but would not damage the fragile object;
determining a position of a tip of the particle removal tool with an optical device prior to conveying the particle removal tool over a location of the foreign particle;
conveying the particle removal tool with the tool gripper over the location of the foreign particle and moving the particle removal tool towards the surface to the cleaning position whereat the threshold force is exerted on the surface with the tip of the particle removal tool; and
lifting the foreign particle away from the surface with the particle removal tool.

2. Method as claimed in claim 1, further comprising the step of ascertaining the location of the foreign particle on the surface by inspecting the surface using an automated optical inspection device.

3. Method as claimed in claim 1, wherein the particle removal tool is gripped and taken by the tool gripper from a cleaning tool station containing a supply of multiple particle removal tools.

4. Method as claimed in claim 1, wherein the force sensing device is a force/pressure transducer which is located at a force calibration station, the tip of the particle removal tool being conveyed to the force calibration station to contact the force/pressure transducer prior to conveying the particle removal tool over the location of the foreign particle.

5. Method as claimed in claim 4, wherein the force/pressure transducer is separate from the tool gripper and the particle removal tool, and the force/pressure transducer comprises a force sensor or a strain gauge.

6. Method for removing a foreign particle from a surface of a fragile object, the method comprising the steps of:
gripping a particle removal tool with a tool gripper;
determining with a force sensing device a cleaning position of the particle removal tool relative to the surface whereat a threshold force is exerted on the surface at the cleaning position, the threshold force being a force that is exerted by the particle removal tool on the surface that would pick up the foreign particle but would not damage the fragile object;
conveying the particle removal tool with the tool gripper over a location of the foreign particle and moving the particle removal tool towards the surface to the cleaning position whereat the threshold force is exerted on the surface; and
lifting the foreign particle away from the surface with the particle removal tool, wherein the force sensing device is a force/pressure transducer which is located at a force calibration station positioned next to an optical device, the optical device being for determining a position of a tip of the particle removal tool prior to conveying the particle removal tool over the location of the foreign particle.

7. Method as claimed in claim 4, further comprising the step of gradually decreasing a distance between the tool gripper and the force/pressure transducer, and determining the cleaning position whereat a force corresponding to the threshold force is detected by the force/pressure transducer.

8. Method as claimed in claim 1, wherein the force sensing device is a force/pressure transducer coupled to the tool gripper, the force/pressure transducer monitoring a force being exerted by the particle removal tool on the surface at each position of the particle removal tool relative to the surface.

9. Method as claimed in claim 8, further comprising the step of monitoring a position of the particle removal tool relative to the surface when the particle removal tool is being moved by the tool gripper.

10. Method as claimed in claim 8, wherein the tool gripper pushes the particle removal tool against the surface until the threshold force is reached, whereupon the particle removal tool is lifted away from the surface together with the foreign particle.

11. Method as claimed in claim 8, wherein the force/pressure transducer comprises a force sensor or a strain gauge.

12. Method as claimed in claim 1, wherein the particle removal tool comprises a gel stick which has a gel-like substance attached to one end of the gel stick for attracting foreign particles.

13. Method as claimed in claim 1, wherein the fragile object is a CMOS sensor that is arranged and conveyed on a carrier.

\* \* \* \* \*